United States Patent
Shumarayev (10) Patent No.: US 7,239,180 B1
(45) Date of Patent: Jul. 3, 2007

(54) PROGRAMMABLE PIN IMPEDANCE REDUCTION ON MULTISTANDARD INPUT/OUTPUTS

(75) Inventor: Sergey Y Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 116 days.

(21) Appl. No.: 11/135,254

(22) Filed: May 23, 2005

(51) Int. Cl.
*H03K 19/0175* (2006.01)

(52) U.S. Cl. .......................... 326/82; 326/30; 326/26; 326/38

(58) Field of Classification Search ............ 326/37–41, 326/26, 27, 30, 82, 83
See application file for complete search history.

(56) References Cited

U.S. PATENT DOCUMENTS

| | | | |
|---|---|---|---|
| 6,433,579 B1 * | 8/2002 | Wang et al. | 326/38 |
| 6,480,026 B2 * | 11/2002 | Andrews et al. | 326/39 |
| 6,625,796 B1 * | 9/2003 | Rangasayee et al. | 716/17 |
| 6,700,823 B1 * | 3/2004 | Rahman et al. | 365/189.05 |
| 2006/0158223 A1 * | 7/2006 | Wang et al. | 326/86 |

OTHER PUBLICATIONS

Thanachayanont, A., and Payne, A., "VHF CMOS integrated active inductor", Electronics Letters vol. 32 No. 11, pp. 999-1000, May 23, 1996.

* cited by examiner

*Primary Examiner*—Don Le
(74) *Attorney, Agent, or Firm*—Fish & Neave IP Group Ropes & Gray LLP (57) ABSTRACT

Programmable logic devices, such as field programmable gate arrays, may have input/output (I/O) circuitry that can be programmed for either differential or single-ended signaling. I/O pins coupled to such programmable I/O circuitry typically have high parasitic input pin capacitance during differential signaling. I/O pins may also have high parasitic input pin inductance. Additional impedance circuit elements such as capacitive or inductive devices are coupled in the programmable I/O circuitry to produce a compensatory impedance that reduces, if not substantially eliminates, the effects of the parasitic input pin capacitance and/or inductance during differential signaling.

28 Claims, 7 Drawing Sheets

PROGRAMMABLE PIN IMPEDANCE REDUCTION ON MULTISTANDARD INPUT/OUTPUTS

BACKGROUND OF THE INVENTION

This invention relates to programmable logic devices that have input/output (I/O) circuitry that can be programmed for either differential or single-ended signaling. More particularly, this invention relates to programmable logic devices wherein the I/O circuitry can be programmed to reduce the effects of parasitic I/O pin capacitance and inductance.

Programmable logic devices (PLDs) are known and commonly include circuits/devices referred to as PLAs (programmable logic arrays), FPGAs (field programmable gate arrays), EPLDs (erasable programmable logic devices), EEPLDs (electrically erasable programmable logic devices), and LCAs (logic cell arrays). Such devices allow a user to electrically program standard, off-the-shelf logic elements to meet a user's specific needs.

Many PLDs have enhanced versatility by employing I/O circuitry that can be programmed to receive either differential or single-ended signals. Differential signals are pairs of signals that propagate in parallel and are received by a respective pair of I/O pins. Each signal is usually a logical complement of the other. That is, when one signal is at a high voltage (e.g., a "logical 1"), the other is at a low voltage (e.g., a "logical 0"), and vice versa.

Such I/O circuitry typically includes an input buffer and an output buffer for single-ended signaling, and a differential input buffer for differential signaling. The three buffers are each coupled to the same I/O pin, with the differential input buffer having a second input coupled to another I/O pin to receive the complementary differential signal. For differential signaling, the input and output buffers are disabled and the differential input buffer is enabled. This allows a pair of differential signals to be respectively received at a pair of I/O pins. For single-ended signaling, the differential input buffer is disabled and either the output buffer is disabled and the input buffer is enabled to receive an individual signal from the I/O pin, or the input buffer is disabled and the output buffer is enabled to drive an individual signal to the I/O pin.

A disadvantage of such programmable I/O circuitry is high input pin impedance during differential signaling. Parasitic capacitance is principally caused by the single-ended input and output buffers, because even though they are disabled during differential signaling, which renders them inoperative, they still form a capacitive load on the I/O pin. Parasitic impedance is mainly caused by wire and other pin connections, and is especially high in the case of wire-bonded packages. High input capacitance or inductance degrades signal quality, which can cause timing and/or logic errors in transmitted data, control, and address signals. Such errors can adversely affect an entire computer system. Moreover, high input impedance is particularly detrimental to speed-sensitive differential signals, which typically operate at high data rates. As process technologies improve and data rates increase, the adverse effects of high input impedance can be expected to increase further.

In view of the foregoing, it would be desirable to be able to provide I/O circuitry that can be programmed for either differential or single-ended signaling without the adverse effects of high parasitic input pin impedance during differential signaling. Further, it would be desirable to be able to provide I/O circuitry that can compensate for parasitic capacitive and inductive loading of I/O pins.

SUMMARY OF THE INVENTION

In accordance with this invention, programmable input/output (I/O) circuitry reduces, if not eliminates, the adverse affects of parasitic input pin impedance during differential signaling, while still advantageously providing programmable single-ended signaling. The programmable I/O circuitry includes one or more additional capacitive or inductive circuit elements coupled between a first I/O pin and a single-ended input buffer which is coupled to a second I/O pin. The second I/O pin is paired with the first I/O pin for differential signaling. This arrangement results in a compensatory impedance during differential signaling that effectively reduces, if not eliminates, the adverse effect of the parasitic input pin capacitance or inductance. Preferably, the impedance value of the compensatory impedance circuit elements is programmable.

Methods of reducing the effects of parasitic input pin capacitance and inductance are also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
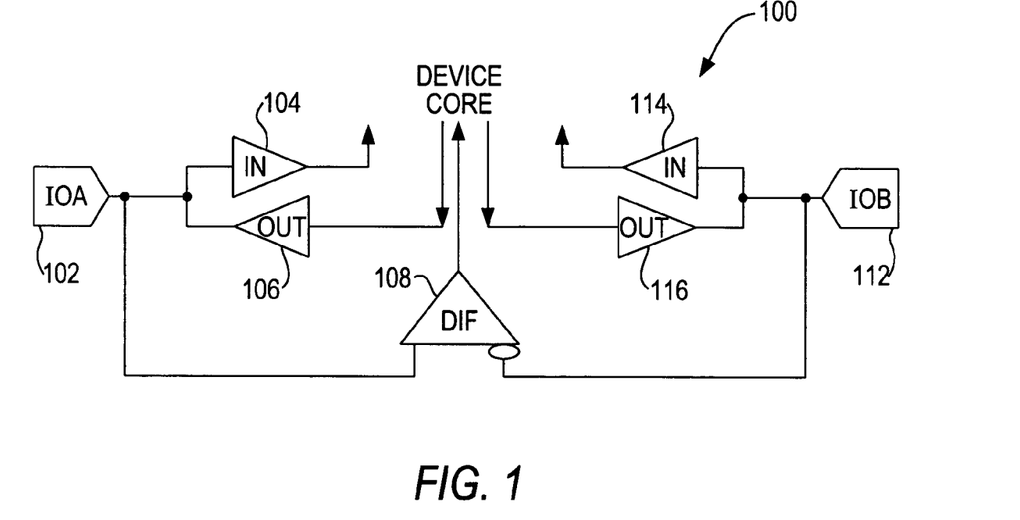
FIG. 1 is a simplified block diagram of representative programmable I/O circuitry that may be used in programmable logic devices.

FIG. 1 illustrates typical programmable input/output (I/O) circuitry 100, which may be part of a programmable logic device such as a field programmable gate array. I/O pad 102 is typically coupled to an input buffer 104 and to an output buffer 106. I/O pad 102 is also typically coupled to an input of a differential input buffer 108. Similarly, a second I/O pad 112, paired with I/O pad 102, is typically coupled to the other (complementary) input of differential input buffer 108. I/O pad 112 is also coupled to an input buffer 114 and to an output buffer 116. I/O pads 102 and 112 are each coupled to respective I/O pins of the package containing the device of which I/O circuitry 100 is a part.

Note that as used herein, "coupled to" does not necessarily mean "connected directly to." There may be, for example, intervening circuit elements.

For single-ended signaling at I/O pad 102, differential input buffer 108 is disabled. To receive a signal at I/O pad 102, output buffer 106 is also disabled, while input buffer 104 is enabled. To output a signal from I/O pad 102, input buffer 104 is disabled, while output buffer 106 is enabled.

Similarly, for single-ended signaling at I/O pad 112, differential input buffer 108 is disabled. To receive a signal at I/O pad 112, output buffer 116 is disabled, while input buffer 114 is enabled. To output a signal from I/O pad 112, input buffer 114 is disabled, while output buffer 116 is enabled.

For differential signaling at I/O pads 102 and 112, input buffers 104 and 114 and output buffers 106 and 116 are disabled, while differential input buffer 108 is enabled. This allows a device on which I/O circuitry 100 has been fabricated to receive a pair of differential signals at I/O pads 102 and 112. To output differential signals from I/O pads 102 and 112, differential input buffer 108 and input buffers 104 and 114 are disabled, while output buffers 106 and 116 are enabled.

A disadvantage of I/O circuitry 100 is high parasitic input impedance resulting from the coupling of input, output, and differential input buffers to the I/O pad. The high input impedance is particularly disadvantageous during high-speed differential input signaling, when data rates (i.e., the rate at which incoming signals are received) are high. While the unused single-ended input and output buffers are disabled during differential signaling, the additional circuitry required for single-ended signaling forms a capacitive load on the I/O circuitry and limits the rate at which differential signals can be received. Similarly, the on-chip and off-chip circuitry and wires connected to the I/O pins form an inductive load which may reduce signal quality.

Figure 2:
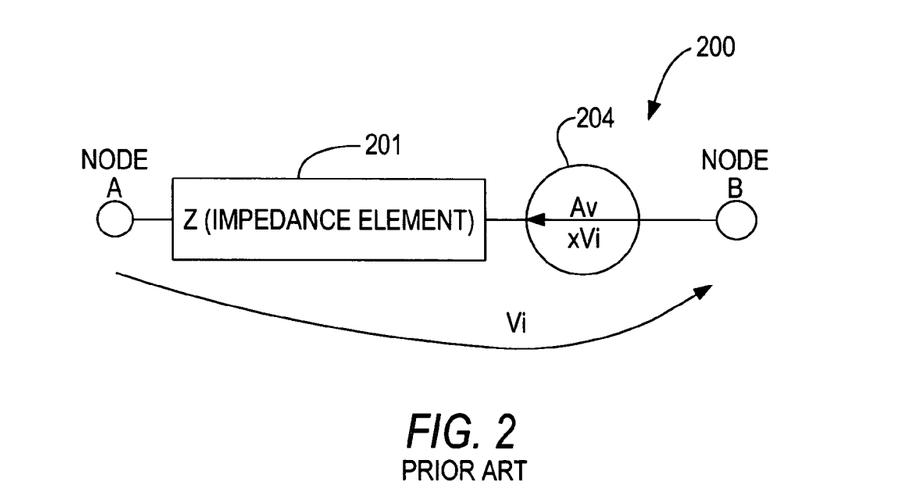
FIG. 2 is a simplified block diagram of an impedance multiplier.

FIG. 2 shows very generally an impedance multiplier 200 coupled between nodes A and B. Impedance multiplier 200 includes a passive impedance element 201 having an impedance Z and an amplifier 204 having a gain $A_v$. Note that the amplification gain $A_v$ may be either a positive or negative gain. The effective impedance seen at input node A is either $Z(A_v)$ or $-Z(A_v)$, depending on whether the amplification at amplifier 204 is positive (non-inverting) or negative (inverting). Thus, for example, if impedance element 201 were a capacitive element, impedance multiplier 200 can be used to produce a larger positive or negative capacitance. And, as is known, the capacitance of capacitive elements coupled in parallel is determined by simply adding their individual capacitances.

Figure 3:
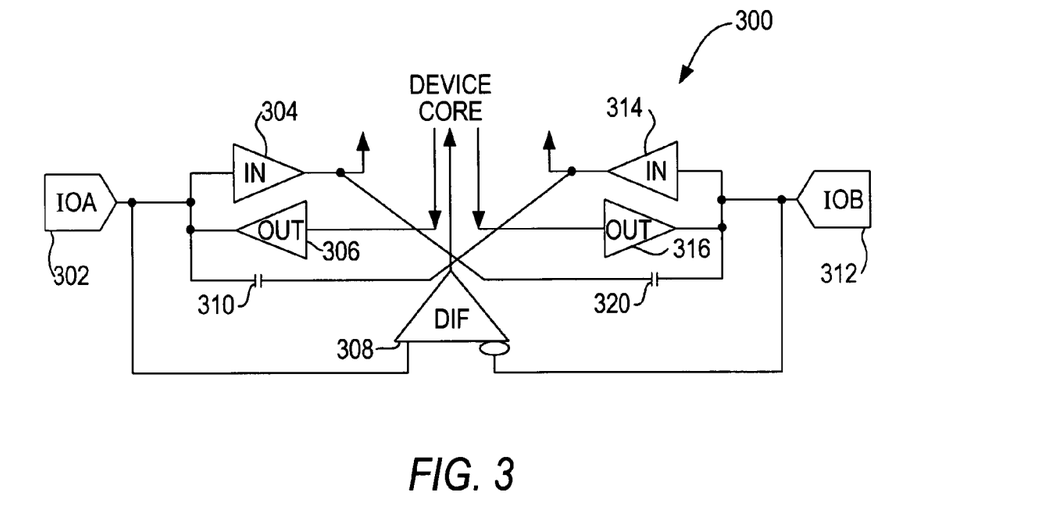
FIG. 3 is a simplified block diagram of an embodiment of programmable I/O circuitry according to the invention.

FIG. 3 shows programmable I/O circuitry 300 in accordance with the invention. I/O circuitry 300 includes the following: single-ended input buffer 304 and output buffer 306 both coupled to I/O pad 302, single-ended input buffer 314 and output buffer 316 both coupled to I/O pad 312, and differential input buffer 308 having a pair of inputs coupled respectively to I/O pads 302 and 312. Additionally, I/O circuitry 300 includes capacitive elements 310 and 320. Capacitive element 310 is coupled between I/O pad 302 and the output of "opposite" input buffer 314. Similarly, capacitive element 320 is coupled between I/O pad 312 and the output of "opposite" input buffer 304. Note that capacitive elements 310 and 320 may each be more than the one capacitive element shown and may include other circuit elements. Capacitive elements 310 and 320 may each be, for example, one or more capacitors or preferably varactors coupled in series.

For differential input signaling, I/O circuitry 300 operates preferably as follows: output buffers 306 and 316 are disabled, differential input buffer 308 is enabled and, unlike I/O circuitry 100, input buffers 304 and 314 are each enabled. Capacitive element 310 and input buffer 314 accordingly form an impedance multiplier as seen from I/O pad 302. Similarly, capacitive element 320 and input buffer 304 form an impedance multiplier as seen from I/O pad 312. Thus, the effective capacitances of capacitive elements 310 and 320 are multiplied by the gain of input buffers 314 and 304, respectively.

Figure 4:
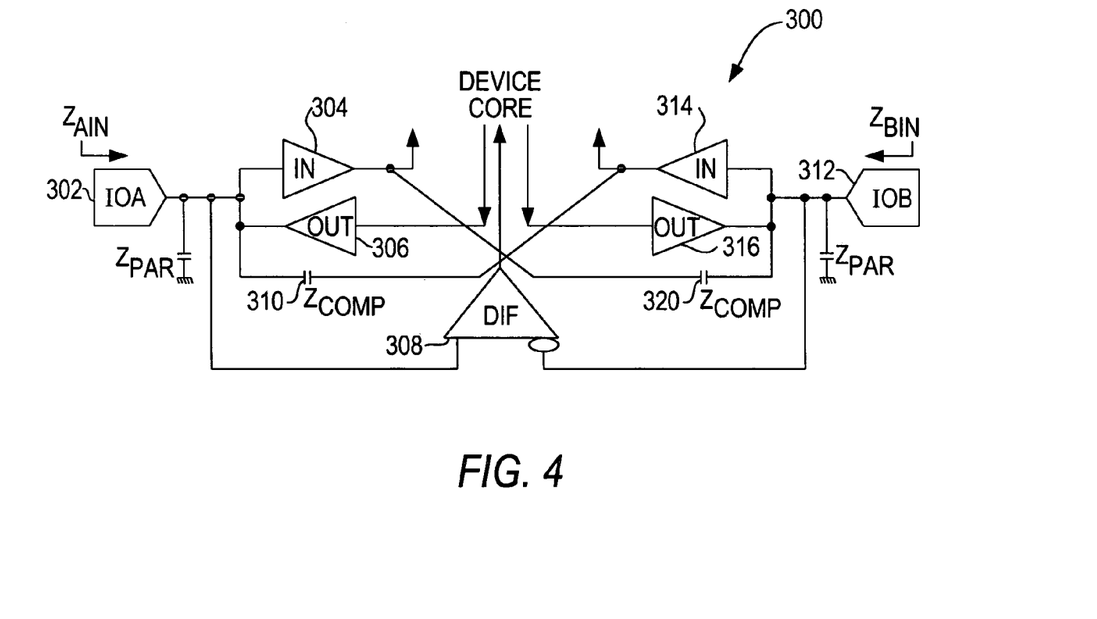
FIG. 4 is a simplified diagram of a more detailed embodiment of programmable I/O circuitry according to the invention.

FIG. 4 shows a diagram of the circuit shown in FIG. 3 with additional annotations referred to in the description below. The total effective impedances $Z_{Ain}$ and $Z_{Bin}$ seen at input I/O pads 302 and 312 can be expressed as: $Z_{in} \approx Z_{par} + Z_{comp}*A_v$ where $Z_{par}$ is the total parasitic impedance seen at either of input I/O pads 302 and 312; $Z_{comp}$ is the total impedance of either of capacitive element 310 or 320; and $A_v$ is the gain of input buffer 314 or 304. By setting the impedance of the compensatory capacitive element 310 or 320 and the gain $A_v$ of input buffers 314 or 304 such that $Z_{par} \approx -Z_{comp}*A_v$, the input impedance seen at the input I/O pads 302 or 312 is minimized.

Figure 5:
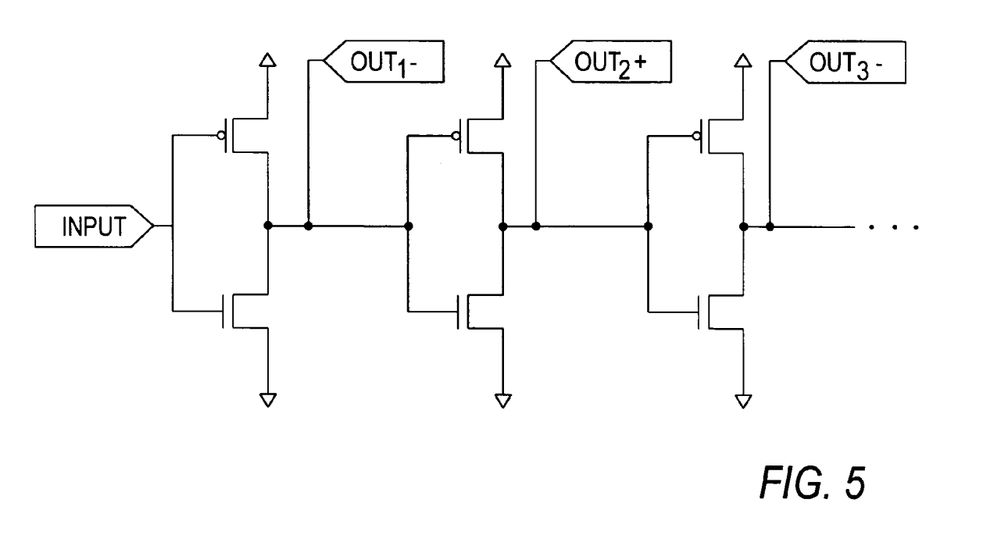
FIG. 5 is a circuit diagram of an embodiment of an input buffer that may be used in the programmable I/O circuitry according to the invention.

The compensatory impedance $-Z_{comp}*A_v$, where $-Z_{comp}*A_v$ is negative, can be obtained using capacitive elements with positive impedance values $Z_{comp}$ and inverting buffers 304 and 314 with gains equal to $-A_v$. Alternatively, capacitive elements may be combined with non-inverting buffer gains in cases where input pins are inductively loaded ($Z_{par}$ negative) and $-Z_{comp}*A_v$ is a positive number. The structure of the input buffer may resemble that shown in the illustrative buffer embodiment in FIG. 5. In this embodiment, the buffer contains a series of stages providing both inverting and non-inverting buffer outputs. The buffer can thus provide both an inverting or non-inverting output with total gain $-A_v$ or $A_v$, allowing for positive or negative compensation of parasitic input impedances, as well as inverting or non-inverting outputs for passing either the single-ended input signal or its complement to the device core. The buffer may also provide outputs with different amplification gain levels, or outputs with programmably variable gains. These outputs may be used to programmably amplify the value of capacitive elements 310 and 320, or to programmably amplify the signals received at each input pin before passing them on to the device core.

Figure 6:
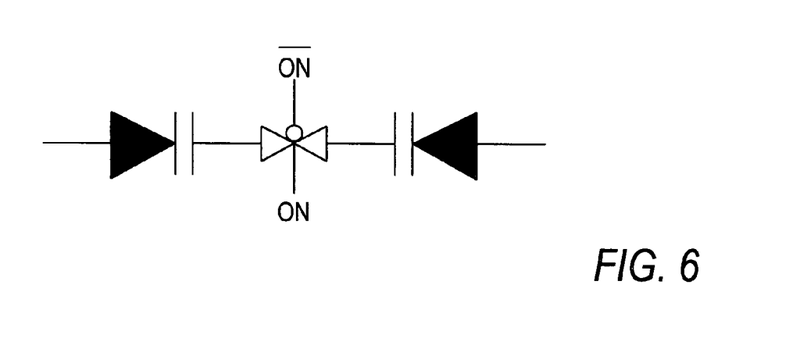
FIG. 6 is a circuit diagram of an embodiment of the capacitive element of the I/O circuitry of FIG. 3 according to the invention.
Figure 7:
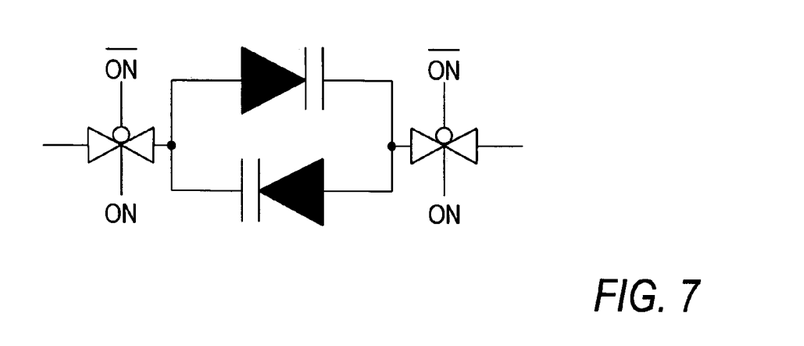
FIG. 7 is a circuit diagram of an embodiment of a programmable capacitive element of the I/O circuitry of FIG. 3 according to the invention.

In order to further adjust the total compensatory impedance $-Z_{comp}*A_v$, capacitive elements 310 and 320 preferably have programmable capacitance values $Z_{comp}$. While these capacitive elements may be formed using single capacitors, arrangements of multiple capacitors connected together, or programmable arrangements of such capacitors, variable capacitance varactors are preferably used. Single varactors can be used to minimize the on-chip area occupied by the varactors. Alternatively, FIG. 6 and FIG. 7 display two illustrative embodiments of multi-varactor implementations of capacitive elements 310 and 320. The back-to-back varactor implementation shown in FIG. 6 provides an improved capacitance linearity over a given voltage range as compared to a single varactor design. Since varactors show non-linear behavior as voltage across them is increased, the series back-to-back varactor implementation reduces these non-linearities by cutting in half the voltage across each varactor. Additionally, the back-to-back implementation provides a natural point for placing a pass gate between the two varactors. The pass-gate is used to programmably connect capacitive elements 310 and 320 when I/O pads 302 and 312 are used for differential input signaling, or to programmably disconnect capacitive elements 310 and 320 when they are being used for single-ended signaling. The drawback of the back-to-back varactor implementation is that by placing the varactors in series, the capacitance of the series-combination of varactors is roughly equal to the capacitance of each varactor. To obtain a capacitive element 310 or 320 of a given capacitance value, two varactors are required, each of which has the given capacitance value. The two varactors occupy double the amount of on-chip area required to provide a given capacitance value. An alternative anti-parallel varactor structure such as that shown in FIG. 7 may be used to reduce the on-chip area required by the varactors. The anti-parallel varactor structure requires two varactors, each with a value of half the total capacitance required (hence each occupying roughly half the on-chip area of a single varactor with the required capacitance value). The anti-parallel varactor structure may also include pass-gates placed at both nodes of the anti-parallel varactor structure, allowing one to programmably connect or disconnect the capacitive elements 310 and 320 from the other I/O circuitry.

For single-ended input and output signaling and for differential output signaling, I/O circuitry 300 operates substantially similarly, if not identically, to I/O circuitry 100. That is, for single-ended input signaling, differential input buffer 308 and output buffers 306 and 316 are disabled, while input buffers 304 and 314 are enabled. For single-ended output signaling, differential input buffer 308 and input buffers 304 and 314 are disabled, while output buffers 306 and 316 are enabled. And, for differential output signaling, input buffers 304 and 314 and differential input buffer 308 are disabled, while output buffers 306 and 316 are enabled. Capacitive elements 310 and 320 have substantially no effect on the operation of single-ended signaling or differential output signaling.

Figure 8:
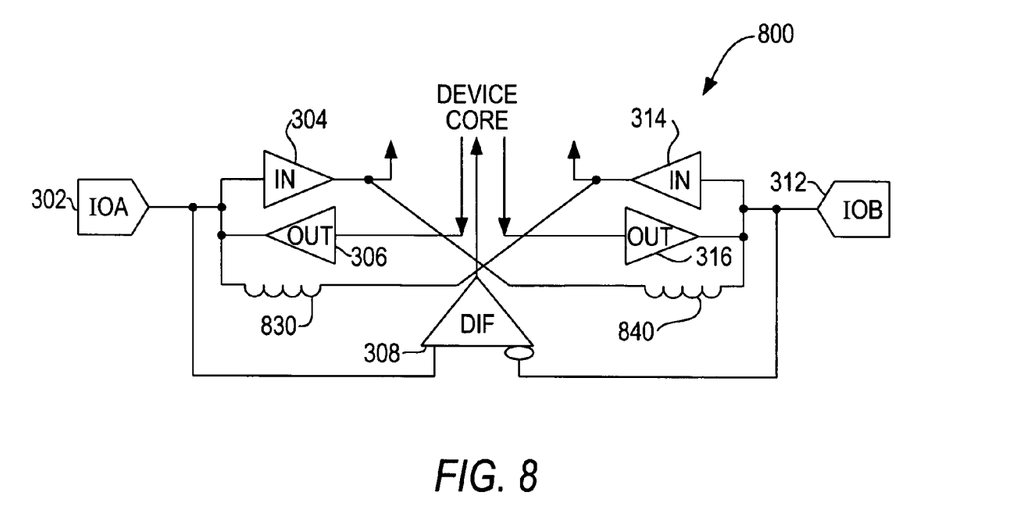
FIG. 8 is a simplified circuit/block diagram of another embodiment of programmable I/O circuitry including inductive elements according to the invention.

FIG. 8 shows an alternative embodiment of programmable I/O circuitry in accordance with the invention. This embodiment uses inductive elements 830 and 840 instead of capacitive elements 310 and 320 to provide compensatory impedances. The circuit of FIG. 8 is substantially similar to the circuit of FIG. 3, except that capacitive elements 310 and 320 have been replaced by inductive elements 830 and 840, respectively. Inductive elements 830 and 840 are used in substantially the same way as capacitive elements 310 and 320 to provide compensatory impedances to input pin impedances $Z_{par}$. However, inductive elements 830 and 840 have negative impedance values. As a result, negative compensation of input pin capacitance $Z_{par}$ is done using non-inverting gain buffers 314 and 304. Alternatively, negative compensation of input pin inductance is done using inverting gain buffers 314 and 304. The total compensatory impedance is thus equal to $Z_{in} \approx Z_{par} + Z_{comp} * A_v$, where $A_v$ is the gain of inverting or non-inverting buffer 314 or 304, and $Z_{comp}$ is the negative impedance value of either of inductive elements 830 or 840.

Note that inductive elements 830 and 840 may each be more than the one inductive element shown and may include other circuit elements. Inductive elements 830 and 840 may each be, for example, interconnections of one or more on-chip inductors or preferably active inductor circuits. Interconnections of inductors or inductor circuits may include programmable circuitry to selectively connect or disconnect particular inductors from the interconnection of inductors. Active inductor circuits may be advantageous as they do not require the complicated integrated circuit manufacturing methods necessary for producing on-chip inductors. Active inductor circuits may further be advantageous for providing programmably variable inductors. Active inductors are commonly know to those skilled in the art, and many known active inductor circuits may be used in place of inductive elements 830 or 840. Note that high speed active inductor circuits may be used to provide better performance than conventional active inductor circuits.

Figure 9:
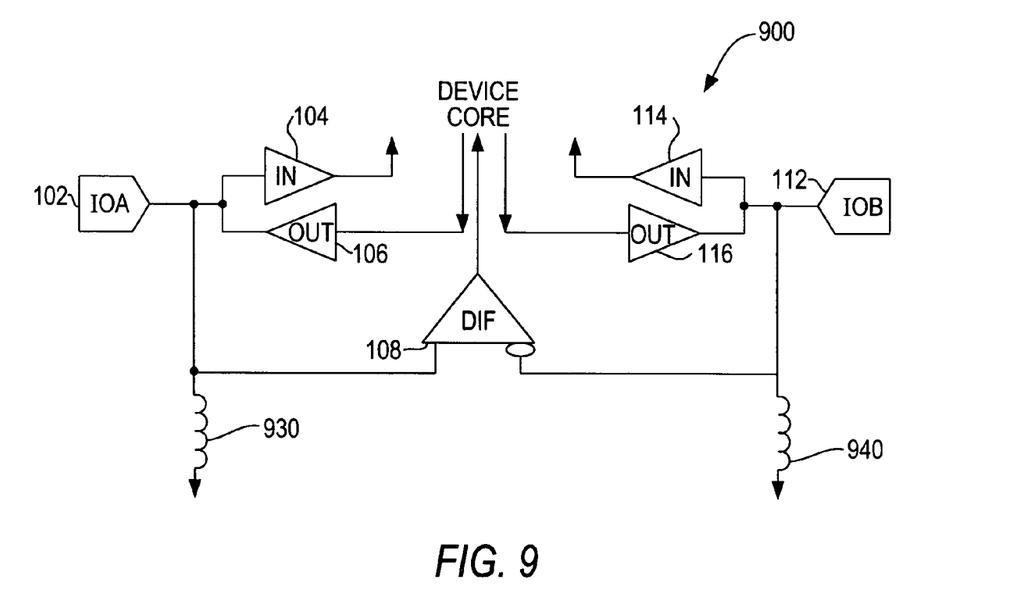
FIG. 9 is a simplified circuit/block diagram of another embodiment of programmable I/O circuitry including inductive elements according to the invention.

FIG. 9 shows an alternative embodiment of the invention including inductive elements 930 and 940. The embodiment shown 900 contains programmable I/O circuitry substantially similar to that previously described in FIG. 1. In addition to the circuitry found in FIG. 1, inductive elements 930 and 940 may be respectively connected between I/O pin 102 and ac ground and between I/O pin 112 ac ground. Inductive elements 930 and 940 are used to provide compensatory impedances to substantially reduce or eliminate the effects of the parasitic input pin capacitance or inductance. Inductive elements 930 and 940 are placed substantially in parallel to input parasitic impedances seen at I/O pins 102 and 112. The total impedance seen at I/O pins 102 and 112 may therefore be substantially equal to the sum of impedances supplied by inductive elements 930 and 940 and parasitic input pin capacitances and/or inductances. The total impedance seen at I/O pins 102 and 112 may therefore be reduced or eliminated by appropriately adjusting the impedances of inductive elements 930 and 940. Note that inductive elements 930 and 940 may be on-chip inductors, on-chip multiplicative inductors including a series connection of an on-chip inductor and an amplifier, or active inductor circuits. Active inductor circuits may be preferred, as they may provide programmable inductance values.

Figure 10:
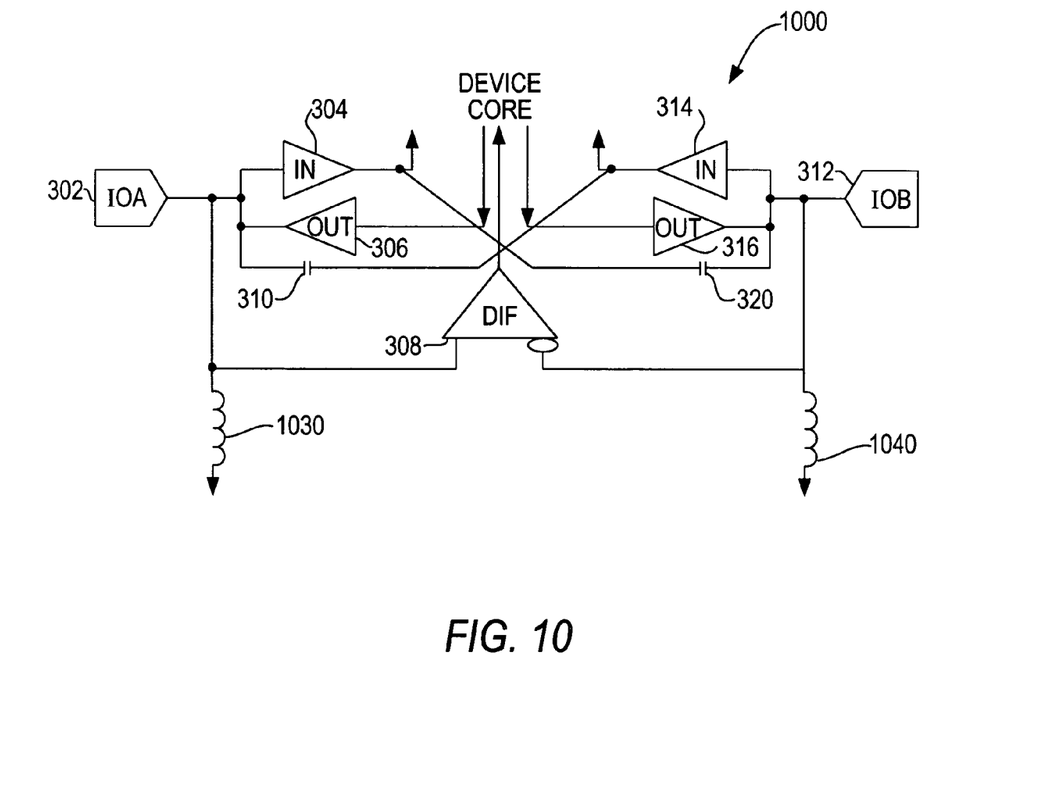
FIG. 10 is a simplified circuit/block diagram of another embodiment of programmable I/O circuitry including inductive elements according to the invention.

FIG. 10 shows an alternative embodiment of the invention including inductive elements 1030 and 1040. In the exemplary embodiment 1000 shown, all elements of programmable I/O circuitry 300 are included in the circuit. In addition, inductive elements 1030 and 1040 may be respectively connected between I/O pin 302 and ac ground and between I/O pin 312 and ac ground. In this embodiment, both capacitive elements 310 and 320 and inductive elements 1030 and 1040 may act to compensate for the parasitic capacitance and inductance seen at input pins 302 and 312. Capacitive elements 310 and 320, connected between their respective input pads 302 and 312 and opposite input buffers 314 and 304, act in substantially the same way as described previously in the contexts of FIGS. 3 and 4. Inductive elements 1030 and 1040 act is substantially the same way as described in the context of FIG. 9. Inductive elements 1030 and 1040 act in consort with capacitive elements 310 and 320 to compensate for input pad parasitic impedance.

Figure 11:
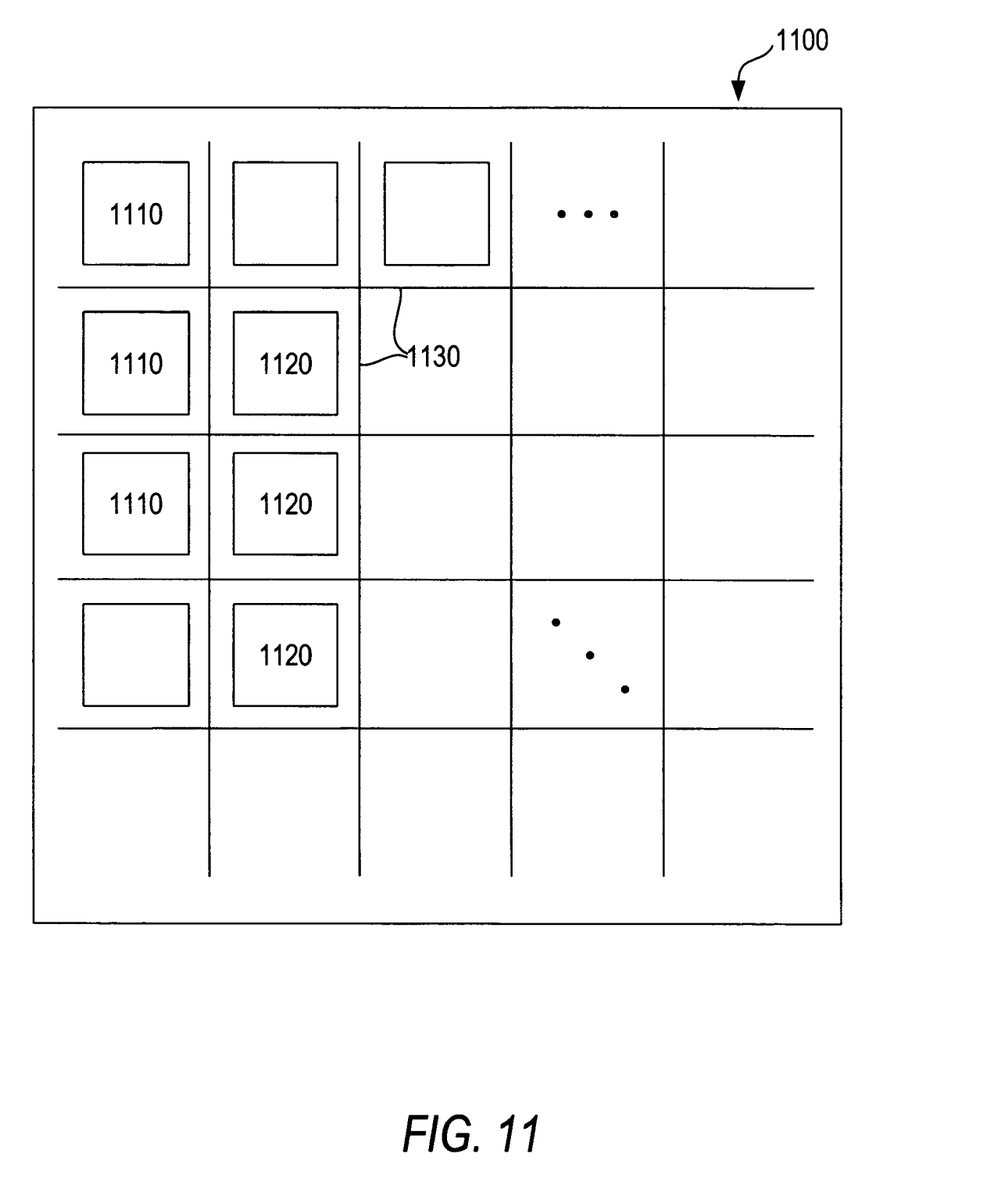
FIG. 11 is a simplified block diagram of a programmable integrated circuit chip employing the invention.

FIG. 11 shows an illustrative programmable logic device (PLD) employing the programmable I/O circuitry of the invention. Programmable logic device 1100 may include I/O blocks 1110, an array of logic blocks 1120, and programmable interconnect lines 1130 used to connect I/O blocks, logic blocks, and other blocks on the PLD. Programmable logic device 1100 may also contain a variety of additional circuitry including, but not limited to, digital signal processors, memory, and PLLS. Some or all of the I/O blocks 1110 on PLD 1100 may be of a type in accordance with the invention. Since I/O circuitry in accordance with the invention is more complex than other types of I/O circuitry, it may be advantageous for PLD 1100 to include some I/O blocks of a type in accordance with the invention and others of a more simple design. In such an embodiment, those I/O blocks 1110 in accordance with the invention can be used preferentially for differential input signaling, high-speed differential input signaling, and other circuit configurations in which input pin capacitance or inductance is detrimental to signal transmission. The more basic I/O blocks on PLD 1100 can be used for single-ended signaling and I/O configurations in which pin parasitic impedance is not as detrimental to signal transmission. Many details of PLD architecture, organization, and circuit design are not necessary for an understanding of the invention and such details are not shown in FIG. 11.

PLDs having programmable I/O circuitry in accordance with the invention are not limited to any one technology, but advantageously can be implemented in various technologies. For example, this circuitry can be implemented in a CMOS transistor technology as well as a bipolar transistor technology.

Figure 12:
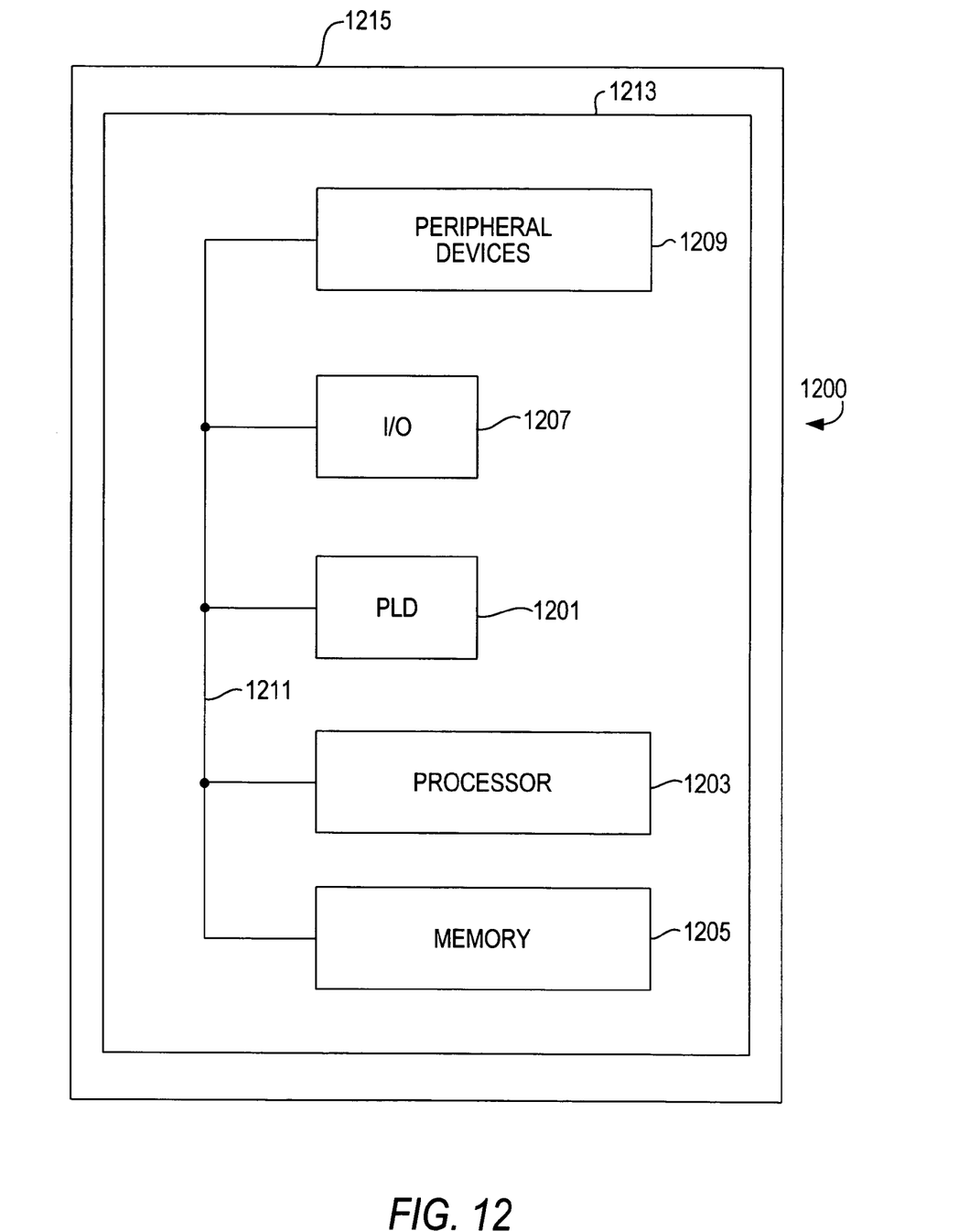
FIG. 12 is a simplified block diagram of an illustrative system employing the invention.

Although the circuitry of the invention has many possible applications, one illustrative use is shown in FIG. 12. Data processing system 1200 includes programmable logic device 1201, which may be an integrated circuit chip or part of an integrated circuit chip. PLD 1201 includes I/O circuitry in accordance with the invention. PLD 1201 may be field programmable, mask programmable, or programmable in any other way. It may be one-time-only programmable, or it may be reprogrammable. System 1200 may also include one or more of the following components: a processor 1203; memory 1205; system level I/O circuitry 1207; and peripheral devices 1209. These components are coupled together by a system bus 1211 and are populated on a circuit board 1213, which is contained in an end-user system 1215. Communication among the various components shown in FIG. 11, and/or with external circuitry, may be of any known type to any desired extent.

System 1200 can be used in a wide variety of applications, such as computer networking, data networking, instrumentation, video processing, digital signal processing, or any other application where the advantage of using programmable or reprogrammable logic is desirable. PLD 1201 can be used to perform a variety of different logic functions. For example, PLD 1201 can be configured as a processor or controller that works in cooperation with processor 1203. PLD 1201 may also be used as an arbiter for arbitrating access to a shared resource in system 1200. In yet another example, PLD 1201 can be configured as an interface between processor 1203 and one of the other components in system 1200. Note that system 1200 is only exemplary and in no way should be construed to limit the true scope and spirit of the invention.

Note that the programmable I/O circuitry of the invention may be used in integrated circuits and devices other than PLDs.

Thus it is seen that programmable I/O circuitry capable of programmably reducing, if not substantially eliminating, the effects of parasitic input capacitance and/or inductance is provided. One skilled in the art will appreciate that the invention can be practiced by other than the described embodiments, which are presented for purposes of illustration and not of limitation, and the invention is limited only by the claims which follow.

The invention claimed is:

1. A method of reducing input/output (I/O) pin impedance on an integrated circuit device, said method comprising:

coupling an impedance element between a first I/O pin and the output of amplification circuitry operative to amplify signals received at a second I/O pin; and amplifying the impedance of said impedance element in response to substantially concurrent receipt of a first signal at said first I/O pin and a second signal at said second I/O pin.

2. The method of claim 1 further comprising:

coupling a second impedance element between said second I/O pin and the output of second amplification circuitry operative to amplify signals received at said first I/O pin; and amplifying the impedance of said second impedance element in response to substantially concurrent receipt of said first signal at said first I/O pin and said second signal at said second I/O pin.

3. The method of claim 2 wherein said first and second signals are a pair of differential signals.

4. The method of claim 1 wherein said impedance element comprises a capacitive element.

5. The method of claim 4 wherein said capacitive element comprises a capacitor or a varactor.

6. The method of claim 4 wherein said capacitive element comprises two series-connected varactors.

7. The method of claim 4 wherein said capacitive element comprises two varactors connected in an anti-parallel configuration.

8. The method of claim 1 wherein said impedance element comprises an inductive element.

9. The method of claim 8 wherein said inductive element comprises an active inductor circuit.

10. The method of claim 1 wherein said amplification circuitry provides to said impedance element amplified signals of signals received at said second I/O pin.

11. The method of claim 1 wherein said amplification circuitry comprises a buffer.

12. A programmable logic device comprising:

a first input/output (I/O) pin;

a second I/O pin;

a first buffer having an input and an output, said first buffer input coupled to said first I/O pin;

a first impedance element coupled between said first buffer output and said second I/O pin; and a differential buffer having a first input coupled to said first I/O pin and a second input coupled to said second I/O pin.

13. The programmable logic device of claim 12 further comprising:

a second buffer having an input and an output, said second buffer input coupled to said second I/O pin; and a second impedance element coupled between said second buffer output and said first I/O pin.

14. The programmable logic device of claim 13 further comprising:

a third buffer having an output coupled to said first I/O pin; and a fourth buffer having an output coupled to said second I/O pin.

15. The programmable logic device of claim 12 wherein said first impedance element comprises a capacitive element.

16. The programmable logic device of claim 15 wherein said capacitive element comprises a capacitor or a varactor.

17. The programmable logic device of claim 15 wherein said capacitive element comprises two series connected varactors.

18. The programmable logic device of claim 15 wherein said capacitive element comprises two varactors connected in an anti-parallel configuration.

19. The programmable logic device of claim 12 wherein said first impedance element comprises an inductive element.

20. The programmable logic device of claim 19 wherein said inductive element comprises an active inductor circuit.

21. The programmable logic device of claim 12 wherein said programmable logic device comprises a field programmable gate array.

22. The programmable logic device of claim 12 wherein said programmable logic device is fabricated on a single integrated circuit chip.

23. A printed circuit board comprising the programmable logic device of claim 12 mounted on said printed circuit board.

24. The printed circuit board of claim 23 further comprising a memory mounted on said printed circuit board.

25. The printed circuit board of claim 23 further comprising processing circuitry mounted on said printed circuit board.

26. A system comprising:
a processor;
a memory coupled to said processor; and
the programmable logic device of claim 12 coupled to at least one of said processor and said memory.

27. A digital processing system comprising:
a processor;
a memory;
the programmable logic device of claim 12;
system level input/output circuitry; and
a system bus coupling said processor, said memory, said programmable logic device, and said system level input/output circuitry.

28. A method of reducing input/output (I/O) pin impedance on a programmable logic device (PLD), said PLD comprising first and second I/O pins, a first input buffer coupled to said first I/O pin, a second input buffer coupled to said second I/O pin, a first output buffer coupled to said first I/O pin, a second output buffer coupled to said second I/O pin, and a differential input buffer coupled to said first and second I/O pins, said method comprising:
coupling a first impedance between an output of said first input buffer and said second I/O pin; and
coupling a second impedance between an output of said second input buffer and said first I/O pin.

* * * * *